United States Patent [19]

Naiki et al.

[11] Patent Number: 5,753,946

[45] Date of Patent: May 19, 1998

[54] FERROELECTRIC MEMORY

[75] Inventors: Ihachi Naiki; Toshinobu Sugiyama, both of Kanagawa, Japan

[73] Assignee: Sony Corporation, Japan

[21] Appl. No.: 598,600

[22] Filed: Feb. 12, 1996

[30] Foreign Application Priority Data

Feb. 22, 1995 [JP] Japan .................. 7-034081
Mar. 10, 1995 [JP] Japan .................. 7-051402

[51] Int. Cl.$^6$ .................................. H01L 29/76
[52] U.S. Cl. .......................... 257/295; 365/145
[58] Field of Search ................ 257/68, 295, 298, 257/300, 303; 365/145

[56] References Cited

U.S. PATENT DOCUMENTS

| | | | |
|---|---|---|---|
| 4,893,272 | 1/1990 | Eaton, Jr. et al. | 365/145 |
| 5,046,043 | 9/1991 | Miller et al. | 365/145 |
| 5,121,353 | 6/1992 | Natori | 365/145 |
| 5,414,653 | 5/1995 | Onishi et al. | 365/145 |
| 5,515,311 | 5/1996 | Mihara | 365/145 |
| 5,541,873 | 7/1996 | Nishimura et al. | 365/145 |
| 5,559,733 | 9/1996 | McMillan et al. | 365/145 |

FOREIGN PATENT DOCUMENTS

| | | |
|---|---|---|
| 2-185788 | 7/1990 | Japan . |
| 2-185789 | 7/1990 | Japan . |
| 3-32066 | 2/1991 | Japan . |
| 5-90607 | 4/1993 | Japan . |

*Primary Examiner*—Sara W. Crane
*Assistant Examiner*—Douglas A. Wille
*Attorney, Agent, or Firm*—Ronald P. Kananen

[57] ABSTRACT

A ferroelectric nonvolatile semiconductor memory using a ferroelectric film as a dielectric film between a floating gate and a control gate, wherein a write switching transistor is provided between the floating gate and the bit line so as to enable the application of any voltage to the ferroelectric film using the voltage applied to the control gate and the voltage applied to the bit line and thereby enabling writing by a low voltage.

13 Claims, 11 Drawing Sheets

ACTIVE REGION

POLICIDE

FERROELECTRIC MEMORY

BACKGROUND OF THE INVENTION

1. Field of the Invention

The present invention relates to a ferroelectric memory for storing data utilizing the direction polarization of a ferroelectric.

2. Description of the Related Art

One type of nonvolatile memory utilizing the reversal (or inversion) of polarization of a ferroelectric is known as a metal ferroelectric metal insulator semiconductor (MFMIS) device wherein an insulation film between a floating gate and a control gate of a floating type nonvolatile memory is replaced by a ferroelectric film.

The storage of binary data in a nonvolatile memory of the MFMIS system is carried out in response to the direction of polarization of the ferroelectric. The reading of the stored data is performed by supplying a predetermined voltage to a control gate thereof and detecting the channel conductance of the transistor, which will differ in accordance with the direction of polarization of the ferroelectric. However, to cause reversal of the polarization of the ferroelectric, it is necessary to apply a high voltage between a control gate and a semiconductor substrate. Further, the majority of the voltage applied between the control gate and the substrate is applied between the floating gate and the substrate, so it suffers from the disadvantage of the reduction of the insulation tolerance of the gate oxide film.

Even if trying to overcome the disadvantage, since the ferroelectric film is directly formed on the floating gate, the electrode areas of a ferroelectric capacitor formed between the floating gate and the control gate and a capacitor formed between the floating gate and the channel could not be independently set and it was difficult to adjust the voltage division ratio.

SUMMARY OF THE INVENTION

An object of the present invention is to provide an improved ferroelectric memory which overcomes these disadvantages of the related art.

According to a first aspect of the present invention, there is provided a ferroelectric memory having a ferroelectric capacitor comprised of a first conductor, a ferroelectric, and a second conductor formed in that order on a semiconductor substrate via a gate insulation film; storing data by a direction of polarization of the ferroelectric which corresponds to a voltage applied to the second conductor, and having a write circuit which holds the first conductor at a predetermined potential at the time of writing.

Preferably, the write circuit is comprised by a transistor which is connected between the first conductor and a predetermined potential line and operationally connects the first conductor and the potential line in accordance with the voltage applied to the gate.

Further, preferably, the transistor is formed on the semiconductor substrate in a specific positional relationship in a vertical direction relative to the ferroelectric capacitor.

In this way, during a write operation, for example, the write circuit is held in an ON state. As a result, the first conductor is held not in the floating state, but at the predetermined potential, for example, 0 V.

Accordingly, all of the write voltage which is applied to the second conductor is applied to the ferroelectric capacitor.

According to a second aspect of the invention, there is provided a ferroelectric memory device storing data by a direction of polarization in a ferroelectric capacitor, comprising a first transistor with a gate electrode connected to one electrode of two electrodes of the ferroelectric capacitor and controlling the current of a bit line in accordance with the direction of polarization of the ferroelectric and a second transistor connected between one electrode of the ferroelectric capacitor and the bit line and operationally connects the one electrode and bit line in accordance with the voltage applied to the gate electrode.

Preferably, the gate electrode of the first transistor and one electrode of the ferroelectric capacitor are connected by a third interconnection layer and the first transistor-and the ferroelectric capacitor are formed separate from each other. Alternatively, a ferroelectric film of the ferroelectric capacitor is formed using the gate electrode of the first transistor as an underlying layer, the ferroelectric film is formed in a region not overlapping a channel portion of the first transistor, and the first transistor and the ferroelectric capacitor are formed separate from each other.

Preferably, in a data write operation, the bit line is set to a predetermined potential in accordance with the write data, then a pulse of a predetermined level is applied to the other electrode of the ferroelectric capacitor so as to polarize the ferroelectric capacitor in different directions according to the data.

Preferably, in a data read operation, a predetermined potential is applied to the other electrode of the ferroelectric capacitor and the difference of the bit line current flowing via the first transistor at this time is detected by the difference of the gate potential of the first transistor so as to read the direction of polarization of the ferroelectric capacitor corresponding to the data.

Since the first transistor for driving the current and the ferroelectric capacitor are formed separate from each other, the transistor may be formed by a process similar to the usual CMOS process. Also, the lower electrode of the ferroelectric capacitor can be optimized independent from the transistor to enable the formation of a good quality ferroelectric film.

The gate electrode potential at the time of reading the first transistor driving the current is determined by the coupling ratio of the gate-substrate capacitances of the ferroelectric capacitor and the gate of the transistor, but since the first transistor and the ferroelectric capacitor are formed separate from each other, it becomes possible to freely set the capacitor area and so forth, and also there is a greater degree of freedom of design of the memory cells.

In the data write operation, the bit line potential is set to 0 V or a fixed potential other than this in accordance with the binary write data. Thereafter, a pulse rising from 0 V to a fixed potential is applied to the other electrode of the ferroelectric capacitor. By this, the ferroelectric capacitor polarizes in different directions according to the binary data.

In the data read operation, a predetermined potential, for example, a power source voltage or other fixed potential, is applied to the other electrode of the ferroelectric capacitor and the difference of the bit line currents flowing via the first transistor at this time is detected from to the difference of the gate potential of the first transistor. By this, the direction of polarization of the ferroelectric capacitor, which corresponds to the binary data, is read.

BRIEF DESCRIPTION OF THE DRAWINGS

These and other objects and features of the present invention will become more apparent from the following description of the preferred embodiments made with reference to the attached drawings, in which:

FIG. 3B is a view showing the polarization of a ferroelectric film in a state where the memory cell is written in;

DESCRIPTION OF THE PREFERRED EMBODIMENTS

Before describing the preferred embodiments, the related art will be explained in further detail with reference to the drawings for facilitating the understand of the preferred embodiments.

As stated earlier, among the various proposals for nonvolatile memories utilizing the reversal (or inversion) of polarization of ferroelectrics, there is the system referred to as a metal ferroelectric metal insulator semiconductor (MFMIS) in which an intermediate insulation film between a polycrystalline silicon floating gate and control gate of a stack gate type transistor such as an EPROM is replaced by a ferroelectric.

Figure 1:
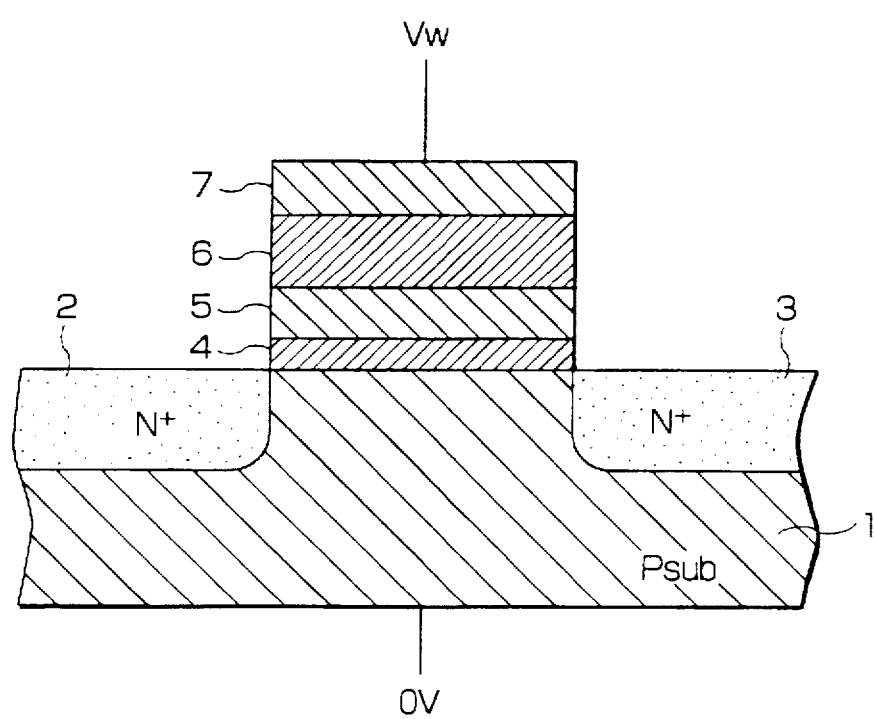
FIG. 1 is a cross-sectional view of a nonvolatile memory cell according to the related art MFMIS system.

FIG. 1 is a cross-sectional view showing a memory cell structure of a nonvolatile memory of the MFMIS system.

This MFMIS type memory cell is configured as a transistor, with an N⁺ source diffusion layer 2 and an N⁺ drain diffusion layer 3 formed on, for example, a p-type semiconductor substrate 1 and with a gate insulation film 4, a floating gate 5 serving as the lower electrode, a ferroelectric film 6, and a control gate 7 serving as an upper electrode formed above the substrate region between the source diffusion layer 2 and the drain diffusion layer 3.

A stack gate type nonvolatile memory having such a configuration stores binary data in accordance with the direction of polarization of the ferroelectric of the ferroelectric film 6. For reading, it applies a predetermined voltage to the control gate 7 and detects the channel conductance of the transistor, which differs according to the direction of polarization of the ferroelectric.

Figure 2:
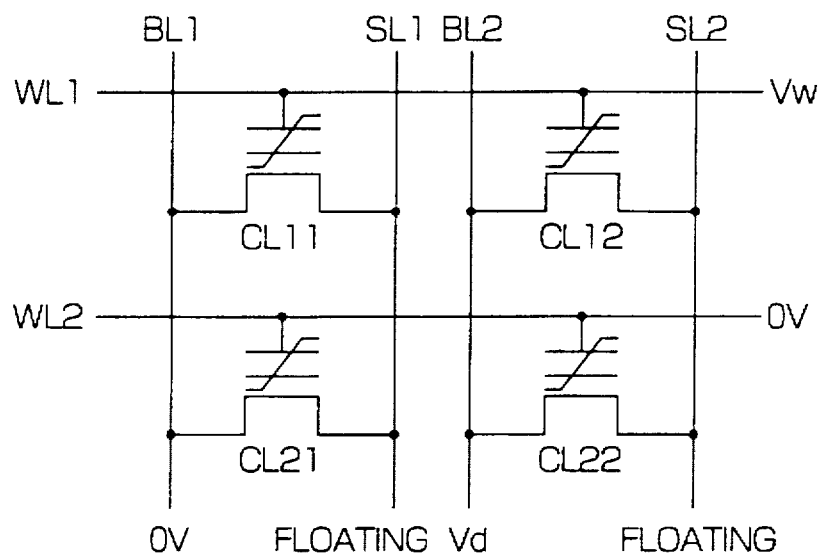
FIG. 2 is an equivalent circuit diagram of a memory array in which the memory cells shown in FIG. 1 are arranged.

FIG. 2 is an equivalent circuit diagram of a memory array comprised of four memory cells CL11, CL12, CL21 and CL22, each having the structure shown in FIG. 1 and each corresponding to one bit are arranged in a 2×2 matrix.

The upper electrodes 7 of the memory cells CL11 and CL12, each corresponding to one bit, in this memory cell array are connected to a word line WL1. The upper electrodes 7 of the memory cells CL21 and CL22 are connected to a word line WL2. The drains of the memory cells CL11 and CL21 are connected to a bit line BL1, the drains of the memory cells CL12 and CL22 are connected to a bit line BL2, the sources of the memory cells CL11 and CL21 are connected to a source line SL1, and the sources of the memory cells CL12 and CL22 are connected to a source line SL2.

Figure 3A:
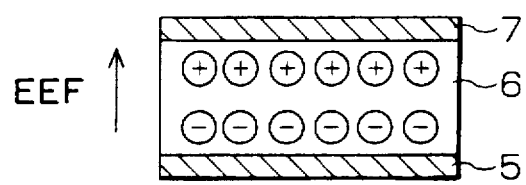
FIG. 3A is a view showing the polarization of a ferroelectric film in a state where the memory cell is erased.
Figure 3B:
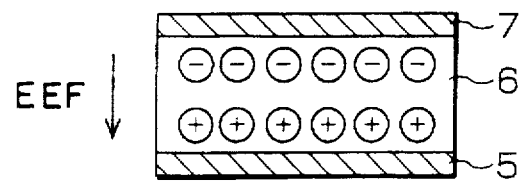
Figure 4:
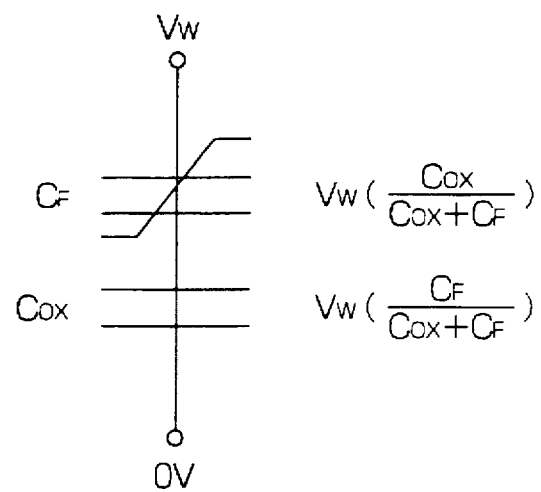
FIG. 4 is a view explaining the distribution of voltage applied to a control electrode.

The relationship between the memory cell data and the direction of reversal of polarization is shown in FIGS. 3A and 3B. FIG. 3A shows the erase state where an external electric field EEF is applied in the direction from the lower electrode 5 to the upper electrode 7; and FIG. 3B shows the write state where a high voltage is applied to the upper electrode 7 and the external electric field EEF is applied in the direction from the upper electrode 7 to the lower electrode 5. When rewriting the memory cell data, as shown in FIG. 3B, a voltage $V_W$, is applied to the upper electrode 7. At this time, the lower electrode 5 becomes the floating state, and the voltage $V_W$ is distributed by a ferroelectric capacitor CF and a gate insulation film capacitor $C_{OX}$ as shown in FIG. 4.

Consider the case of writing data into only the memory cell CL11, that is, causing its polarization to reverse, when all of the memory cells CL11 to CL22 in FIG. 2 are in the erase state.

When rewriting the data of the memory cell CL11, as shown in FIG. 2, the voltage $V_W$ is applied to the word line WL1 to which the memory cell CL11 is connected, 0 V is applied to the word line WL2 and the bit line BL1, and further, for example, a voltage $V_d$ is applied to the bit line BL2 and the source lines SL1 and SL2 are brought to the floating state.

Due to this, a voltage of $V_W \{C_{OX}/(C_{OX}+C_F)\}$ is applied to the ferroelectric capacitor of the memory cell CL11, and a voltage of $(V_W-V_d)\{C_{OX}/(C_{OX}+C_F)\}$ is applied to CL12. Here, it is required to reverse the polarization of the memory cell CL11 and not reverse the polarization of the memory cell CL12, so they become:

$$W_W \{C_{OX}/(C_{OX}+C_F)\} > V_P \quad (1)$$

$$V_{UP} > (V_W-V_d)\{C_{OX}/(C_{OX}+C_F)\} \quad (2)$$

Where, $V_P$ is the lowest voltage of the reversal of polarization, and $V_{UP}$ is the highest voltage of nonreversal.

Figure 5:
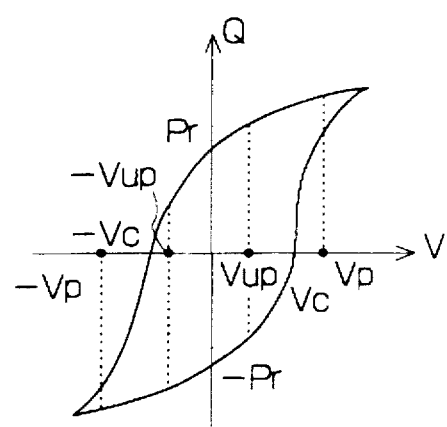
FIG. 5 is a view showing hysteresis of the polarization characteristic of a ferroelectric.

They have a relationship of $V_P > V_C > V_{UP}$ relative to the counter voltage $V_C$. The relationship between these voltages is shown in FIG. 5 showing the hysteresis characteristic.

From the above expressions, the write voltage $V_W$ must be within the following range:

$$V_{UP}\{(C_{OX}+C_F)/C_{OX}\}+V_d > V_W > V_P \{(C_{OX}+C_F)/C_{OX}\}$$

This expression includes the characteristics $C_F$, $V_P$ and $V_{UP}$ determined from the ferroelectric capacitor and the voltage $V_d$ determined from the operation (voltage of the bit line BL2 to which the memory cell CL12 is connected).

However, the ferroelectric materials available at the present time only enable a narrow range of voltage $V_w$. Further, $V_w>>V_{CC}$, and a high voltage is necessary for writing. When the write voltage is a high voltage, as mentioned above, there arises a problem that a high voltage is applied to the gate oxide film 4 which causes destruction of the gate oxide film and problems with reliability.

Also, it is impossible to erase data in bit units. When a voltage of $-V_P$ or more is applied to the word line to which the cell to be erased is connected, all cells of that word line are erased.

On another subject, the dielectric constant of the gate oxide film 4 is 3.9. The dielectric rate of a ferroelectric, on the other hand, is usually about 100 to 1000. Therefore, if the gate oxide film 4 and the ferroelectric film 6 are constituted by films having the same degree of surface area and same degree of thickness, CF/COX becomes about 20 to 200.

Accordingly, most of the voltage applied to the control gate 7 ends up applied between the floating gate 5 and the substrate 1 (Vfb) and will not be applied to the two ends (Vcf) of the ferroelectric which should be polarized.

When the write voltage is set to a high potential, a voltage (counter voltage) necessary for polarization is obtained, but at this time a high voltage is applied to the gate oxide film 4 simultaneously, and therefore there arises a problem of destruction of the gate oxide film and loss of reliability.

That is, in the MFMIS system, it is essentially difficult to design a memory cell that facilitates the reversal of the polarization of the ferroelectric and further gives reliability of the gate oxide film. Also, in an MFMIS, as shown in FIG. 1, the ferroelectric film 6 is directly formed on the floating gate 5, the capacitor areas of the ferroelectric capacitor and the gate oxide film portion cannot be independently set, and the degree of freedom of adjusting the voltage division ratio is considerably restricted.

Further, it suffers from the disadvantages that the ferroelectric film is generally easily influenced in characteristics by the underlying electrode, the elements constituting the ferroelectric diffuse in the gate oxide film 4 to cause deterioration of the gate oxide film 4, etc. It cannot be said that the stack gate structure is a structure conducive to the formation of memory cells.

Due to the above disadvantages, it has been extremely difficult to form cells in an MFMIS and no practical memory has yet-been realized.

The preferred embodiments of the present invention will be explained in detail next.

Figure 6:
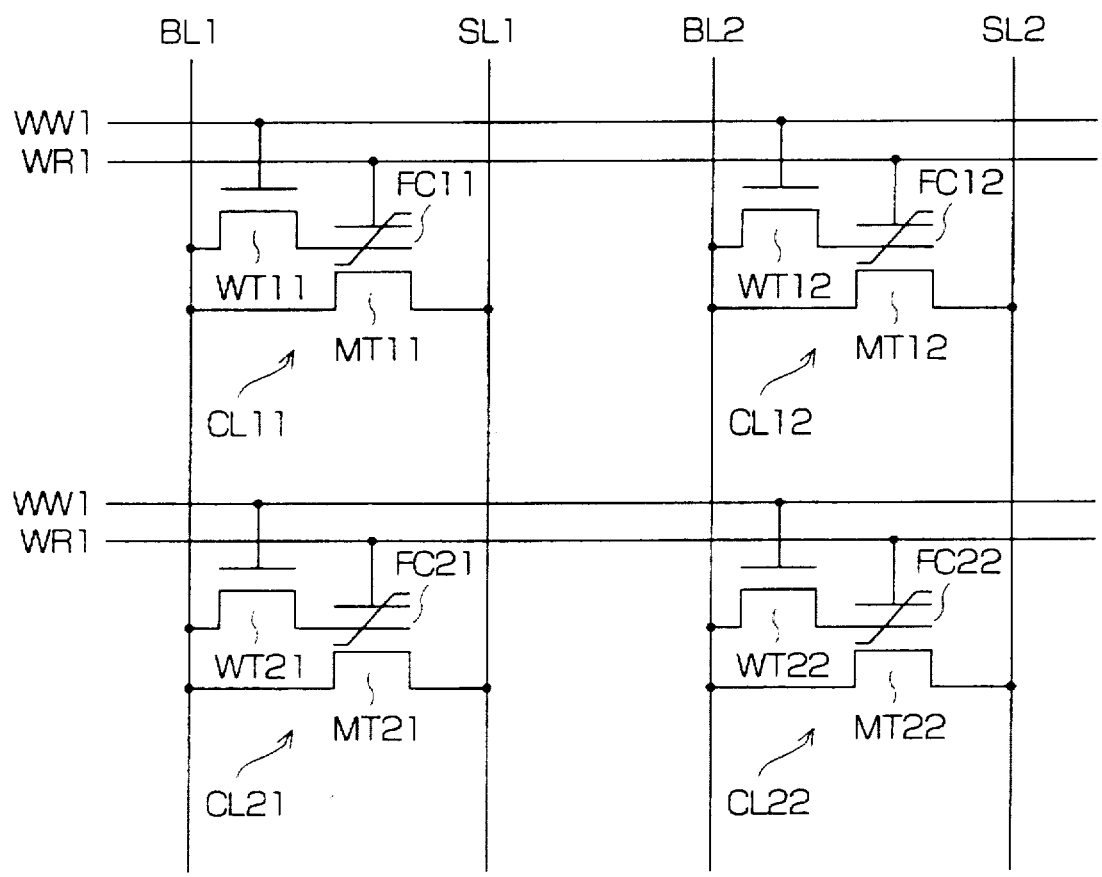
FIG. 6 is an equivalent circuit diagram of a memory array of a first embodiment.

FIG. 6 is an equivalent circuit diagram showing a first embodiment of a memory array of a ferroelectric memory according to the present invention. FIG. 6 shows an example of a 2×2 memory cell array.

The memory cells CL11, CL12, CL21, and CL22, each corresponding to 1 bit, in the present memory cell array are constituted by the memory transistors MT11, MT12, MT21, and MT22 having similar structures to the cell structure of FIG. 1 and provided with ferroelectric capacitors FC11, FC12, FC21, and FC22 and by the write transistors WT11, WT12, WT21, and WT22 which are connected between the lower electrodes of the memory transistors MT11, MT12, MT21, and MT22 and the bit line and have gate electrodes connected to the word lines WW1 and WW2 different from the word lines WR1 and WR2 for the memory transistors.

The specific connections are as follows:

The lower electrode of the memory transistor MT11 of the memory cell CL11 and the source/drain electrode of the write transistor WT11 are connected; the lower electrode of the memory transistor MT12 of the memory cell CL12 and the source/drain electrode of the write transistor WT12 are connected; the lower electrode of the memory transistor MT21 of the memory cell CL21 and the source/drain electrode of the write transistor WT21 are connected; and the lower electrode of the memory transistor MT22 of the memory cell CL22 and the source/drain electrode of the write transistor WT22 are connected.

The gate electrodes of the memory transistors MT1 and MT12 of the memory cells CL11 and CL12 are connected to the word line WR1; and the gate electrodes of the write transistors WT11 and WT12 are connected to the word line WW1. Similarly, the gate electrodes of the memory transistors MT21 and MT22 of the memory cells CL21 and CL22 are connected to the word line WR2; and the gate electrodes of the write transistors WT21 and WT22 are connected to the word line WW2.

Further, the drain electrodes of the memory transistors MT11 and MT21 and the write transistors WT11 and WT12 are connected to the bit line BL1; and the source electrodes of the memory transistors MT11 and MT21 are connected to the source line SL1. Also, the drain electrodes of the memory transistors MT12 and MT22 and the write transistors WT12 and WT22 are connected to the bit line BL2, and the source electrodes of the memory transistors MT12 and MT22 are connected to the source line SL2.

In this way, in the memory cells CL11, CL12, CL21, and CL22 according to the present embodiment, at the time of a write operation, the lower electrodes on the gate insulation films of the memory transistors MT11, MT12, MT21, and MT22 are not floating as in the related art, but are connected to the bit lines through the write transistors WT11, WT12, WT21, and WT22, so the reversal of the polarization of the ferroelectric capacitor is carried out by the voltage difference between the word lines WR1 and WR2 and the bit lines BL1 and BL2. Namely, all of the write voltage $V_W$ is applied to the ferroelectric capacitor.

Figure 7:
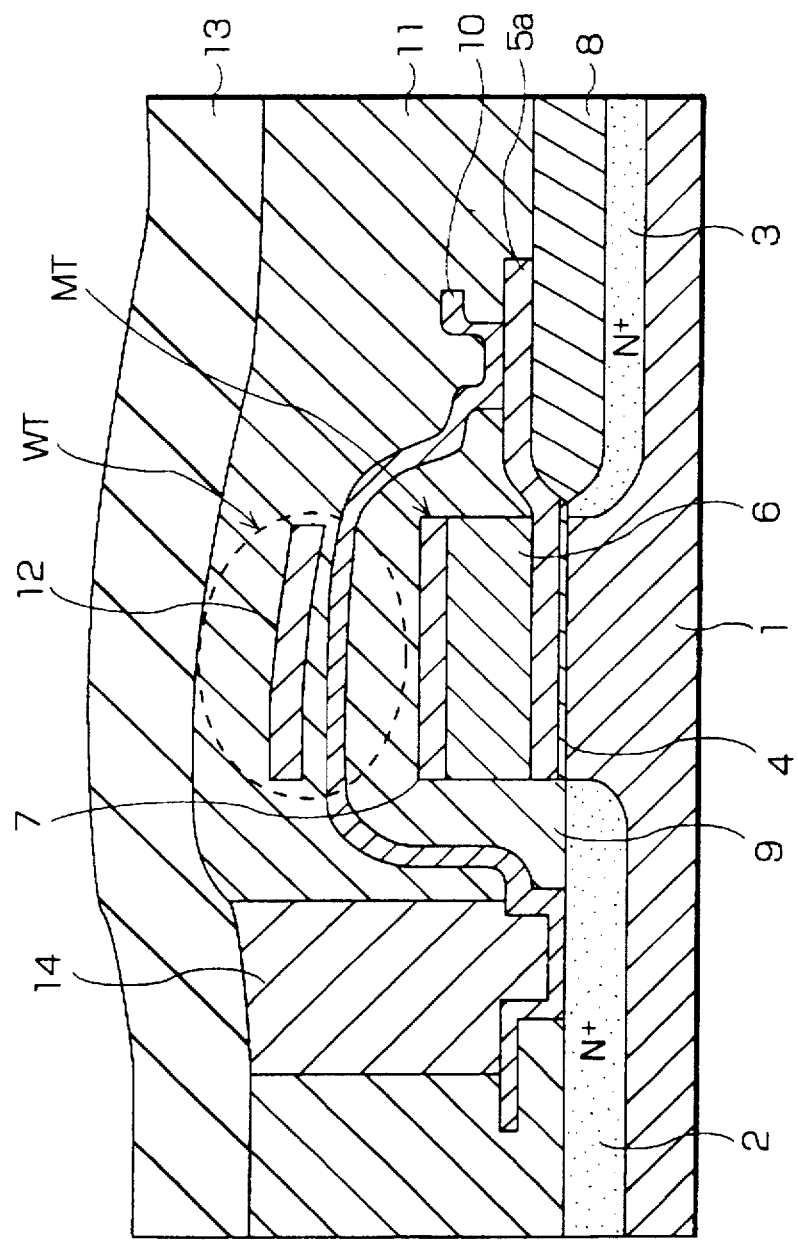
FIG. 7 is a cross-sectional view showing the structure of a memory cell of a first embodiment of the present invention.

FIG. 7 is a cross-sectional view showing an example of structure of a memory cell according to the present invention, in which the same constituent parts as those of FIG. 1 showing the conventional structure are indicated by the same references.

Namely, in FIG. 7, 1 denotes a p-type semiconductor substrate; 2, an $N^+$- type source diffusion layer; 3, an $N^+$- type drain diffusion layer; 4, a gate insulation film; 5a, a lower electrode; 6, a ferroelectric film; 7, an upper electrode; 8, an element isolation film; 9 and 11, inter-layer insulation films; 10, a polycrystalline silicon layer for the write transistor WT; 12, a polycrystalline silicon layer acting as the gate electrode of the write transistor WT; 13, an aluminum interconnection serving as the bit line; and 14, a polycrystalline silicon plug.

As shown in FIG. 7, in this memory cell, the write transistor WT is fabricated by a thin film transistor and the write transistor WT is arranged so as to be positioned just above the memory transistor MT. The lower electrode 5a of the memory transistor MT is extended to the upper portion of the source diffusion layer 3 and connected to the source-drain region of the thin film transistor by the polycrystalline silicon layer 10.

In the case of such a structure, in comparison with the related art memory cell, the extended region of the lower electrode only causes an increase of the memory cell size.

Next, an explanation will be made of the data write operation using this configuration.

A data write operation is carried out at one time for all cells connected to the word lines WR and WW. The procedure thereof is shown below.

First, the level of the word line WW is set to the $V_{CC}$ level and the write transistor WT is turned ON.

At this time, 0 V is applied to the word line WR, and a voltage VB of the bit line connected to the memory cells for applying an upward electric field as shown in FIG. 3A to the ferroelectric capacitor FC is set to the $V_{CC}$ level.

Then, the level of the word line WR is set to the $V_{CC}$ level, and the voltage VB' of the bit line connected to the memory cell for applying a downward electric field as shown in FIG. 3B to the ferroelectric capacitor FC is made 0 V.

At this time, to prevent the reversal of the polarization of the cell in which the data was written, the bit line voltage VB of the memory cell in which the data was written is held at $V_{CC}$.

Note that, at the time of this write operation, the source line SL is held in the floating state.

Also, at the time of a read operation, the level of the word line WW is set to 0 V, the write transistor WT is turned OFF, and the same procedure is carried out as that of the related art case.

As explained above, according to the present embodiment, a write transistor WT operationally connecting the lower electrode 5 and the bit line in accordance with the gate voltage is provided between the lower electrode 5 and the bit line. Therefore, it is sufficient if the write voltage is about $V_{CC}$, a high voltage is not necessary, there is no disadvantage of disturbance of the other cells, and it is possible to rewrite data at one time for each word line.

Note that, in the present embodiment, the explanation was made of the case where the drain electrodes of the memory transistors and the write transistors of the memory cells were connected to the same bit line, but of course it is also possible to connect them to different bit lines.

Moreover, it is also possible to have the gate electrodes of the write transistors WT be used in common by the upper electrodes 7.

Figure 8:
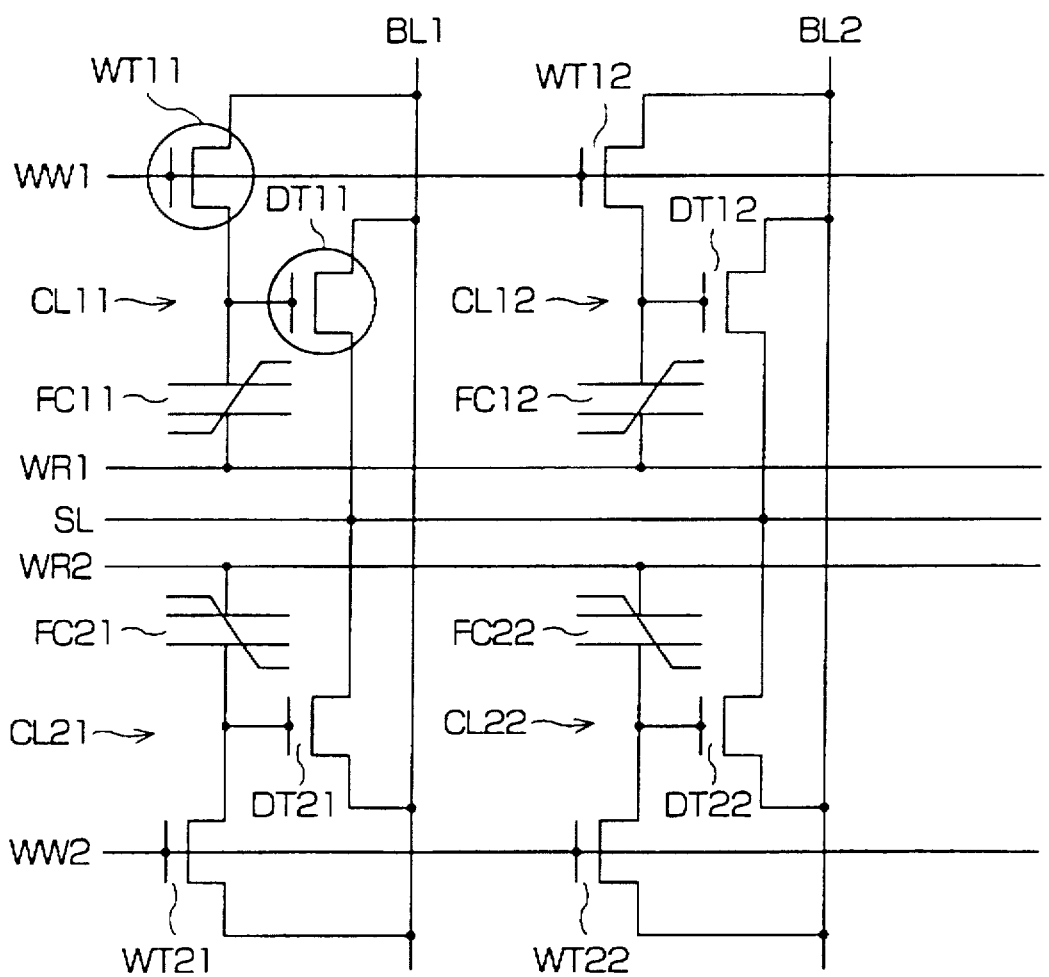
FIG. 8 is an equivalent circuit diagram of the memory array of a second embodiment of the present invention.

FIG. 8 is an equivalent circuit diagram showing a second embodiment of the memory array of the ferroelectric memory according to the present invention.

The memory cells CL11, CL12, CL21, and CL22, each corresponding to 1 bit, in the present memory cell array are constituted by three elements of the ferroelectric capacitors FC11, FC12, FC21, and FC22; the driver transistors DT11, DT12, DT21, and DT22 serving as the first transistors to whose gate electrodes one of the electrodes of the ferroelectric capacitors FC11, FC12, FC21, and FC22 are connected and which control the current of the bit lines by the direction of polarization of the ferroelectric; and write transistors WT11, WT12, WT21, and WT22 serving as the second transistors to whose source electrodes one of the electrodes of the ferroelectric capacitors FC11, FC12, FC21, and FC22 are similarly connected and which perform the switching of conduction between the bit lines BL1 and BL2.

Namely, the present memory cell is formed with the driver transistor DT and the ferroelectric capacitor FC separate from each other and is formed with the write transistor WT and the driver transistor DT clearly separate from each other. One bit is constituted by two transistors and one ferroelectric capacitor.

The specific connections are as follows:

The gate electrodes of the write transistors WT11 and WT12 of the memory cells CL11 and CL12 are connected to the word line WW1; and the gate electrodes of the write transistors WT21 and WT22 of the memory cells CL21 and CL22 are connected to the word line WW2. The other electrodes of the ferroelectric capacitors FC11 and FC12 of the memory cells CL11 and CL12 are connected to the word line WR1; and the other electrodes of the ferroelectric capacitors FC21 and FC22 of the memory cells CL21 and CL22 are connected to the word line WR2.

Further, the drain electrodes of the driver transistors DT11 and DT21 of the memory cells CL11 and CL21 and the drain electrodes of the write transistors WT11 and WT21 are connected to the bit line BL1; the drain electrodes of the driver transistors DT12 and DT22 of the memory cells CL12 and CL22 and the drain electrodes of the write transistors WT12 and WT22 are connected to the bit line BL2; and the source electrodes of the driver transistors DT11, DT12, DT21, and DT22 of all memory cells CL11, CL12, CL21, and CL22 are connected to a common source line SL.

Figure 9:
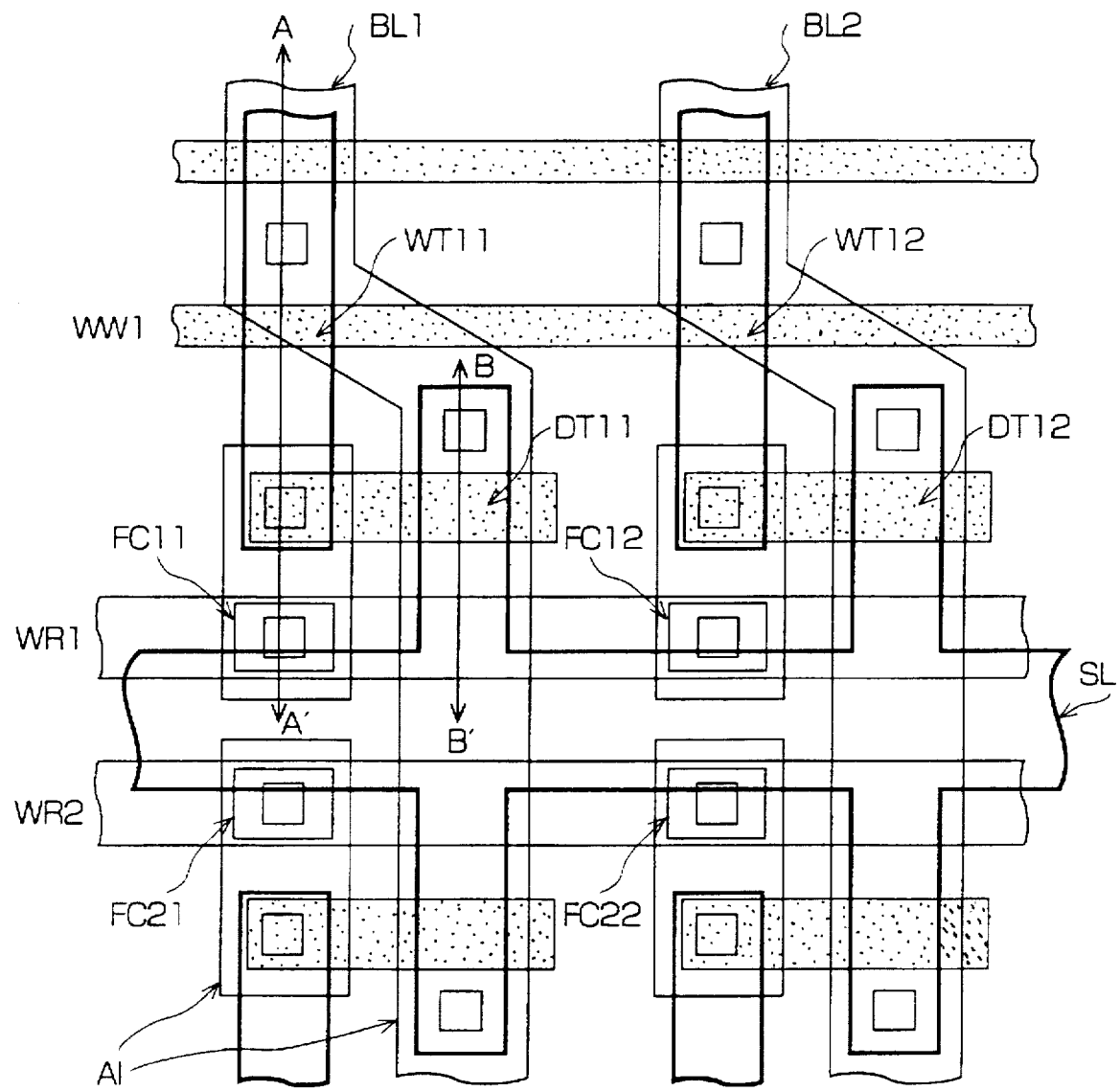
FIG. 9 is a plan view showing a pattern arrangement of the memory array shown in FIG. 8.
Figure 9:
Figure 9:
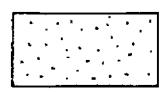
Figure 10:
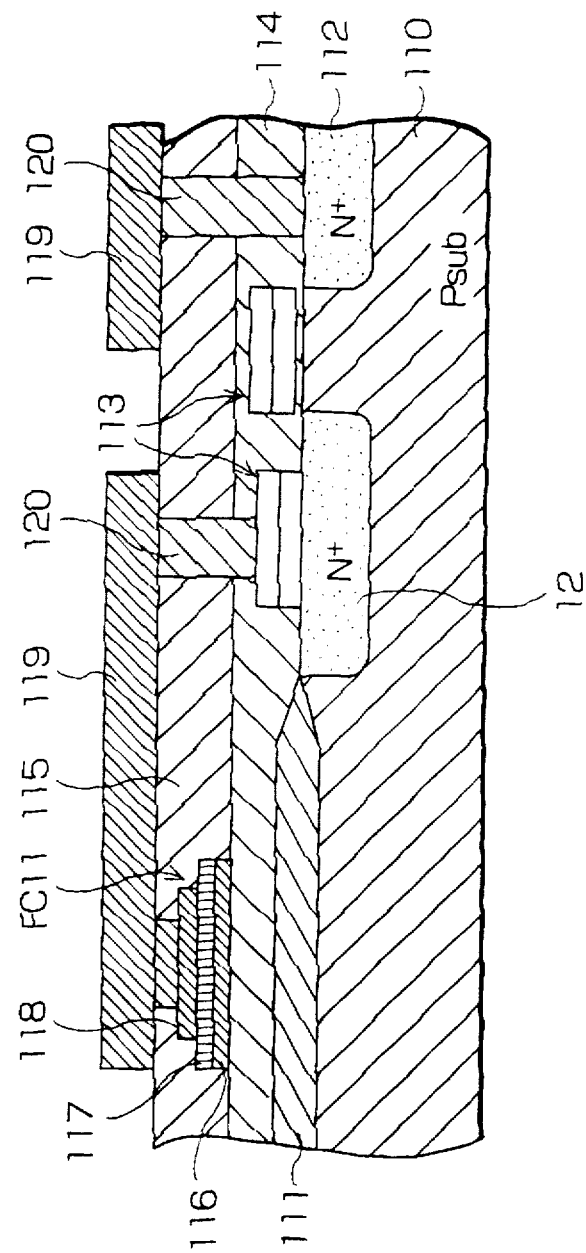
FIG. 10 is a cross-sectional view of a memory cell taken along line A—A' of FIG. 9.

FIG. 9 is a pattern layout view of the present memory cell; FIG. 10 is a cross-sectional view taken along a line A—A' in FIG. 9; and FIG. 11 is a cross-sectional view taken along a line B—B' in FIG. 9.

In the figures, 110 denotes a p-type semiconductor substrate; 111, an element isolation region such as LOCOS; 112, an $N^+$ source-drain diffusion layer; 113, a polyside layer; 114, an interlayer insulation film made of for example borophosilicon glass; 115, an interlayer insulation film made of for example $SiO_2$; 116, a lower electrode made of for example platinum; 117, a ferroelectric film; 118, an upper electrode made of for example platinum; 119, an aluminum interconnection (AL); and 120, a polycrystalline silicon plug.

Figure 11:
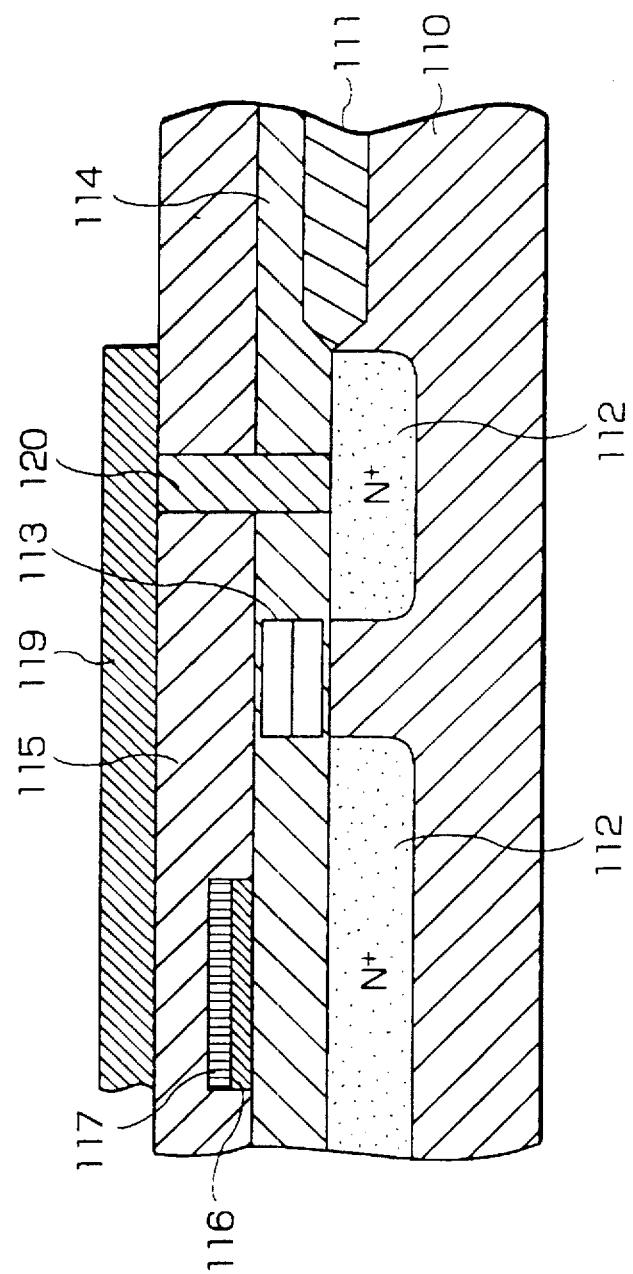
FIG. 11 is a cross-sectional view of a memory cell taken along line B—B' of FIG. 9.

As seen also from FIG. 9 to FIG. 11, the present memory cell differs from the stack gate type cell in which the ferroelectric film is formed directly on the gate electrode of the transistor driving the current at the time of a read operation in that the driver transistor DT driving the current and the ferroelectric capacitor FC are formed separate from each other.

By separating the driver transistor DT and the ferroelectric capacitor FC in this way, the following advantages accrue comparison with the stack gate type cell.

In the stack gate type, the material of the floating gate is simultaneously required to form an underlying layer which can form a ferroelectric film of a good quality and to have a barrier property preventing the elements constituting the ferroelectric from diffusing in the gate oxide film of the transistor. Formation of the floating gate is difficult.

Contrary to this, where the driver transistor DT and the ferroelectric capacitor FC are separate as in the present embodiment, the transistor can be formed by a process similar to the usual CMOS process and the lower electrode 117 of the ferroelectric capacitor FC can be optimized independently from the transistor to enable the formation of a ferroelectric film 118 having a good quality.

Also, the gate electrode potential of the transistor driving the current at the time of a read operation is determined by the coupling ratio of the gate-substrate capacitances of the ferroelectric capacitor FC and the gate of the transistor.

Accordingly, desirably the capacitances are set so as to give the current ratio of the driver transistor DT in the erase state and the write state, but in the stack gate type, since the ferroelectric capacitor is formed on the gate of the transistor, it is difficult to freely set the capacitor area etc.

Contrary to this, when the driver transistor and the ferroelectric capacitor are separate, since the capacitors are independent, it becomes possible to freely set the surface area etc. and also the degree of freedom of the memory cell design becomes greater.

Note that the "separation" of the driver transistor and the ferroelectric capacitor referred to here means the connection of the gate electrode of the driver transistor and the electrode of the ferroelectric capacitor by a third interconnection layer or, where the ferroelectric film is formed by using the gate electrode of the driver transistor as an underlying layer, it means that the ferroelectric capacitor is not formed overlapping the channel portion of the transistor.

Accordingly, it is sufficient so far as the memory cell structure of the present invention satisfies either of these two conditions. Various modifications of the example shown in FIG. 9 are possible. For example, the write transistor WT may be formed by a thin film transistor, the word line WR1 may be arranged on the word line WW1, etc.

Figure 12:
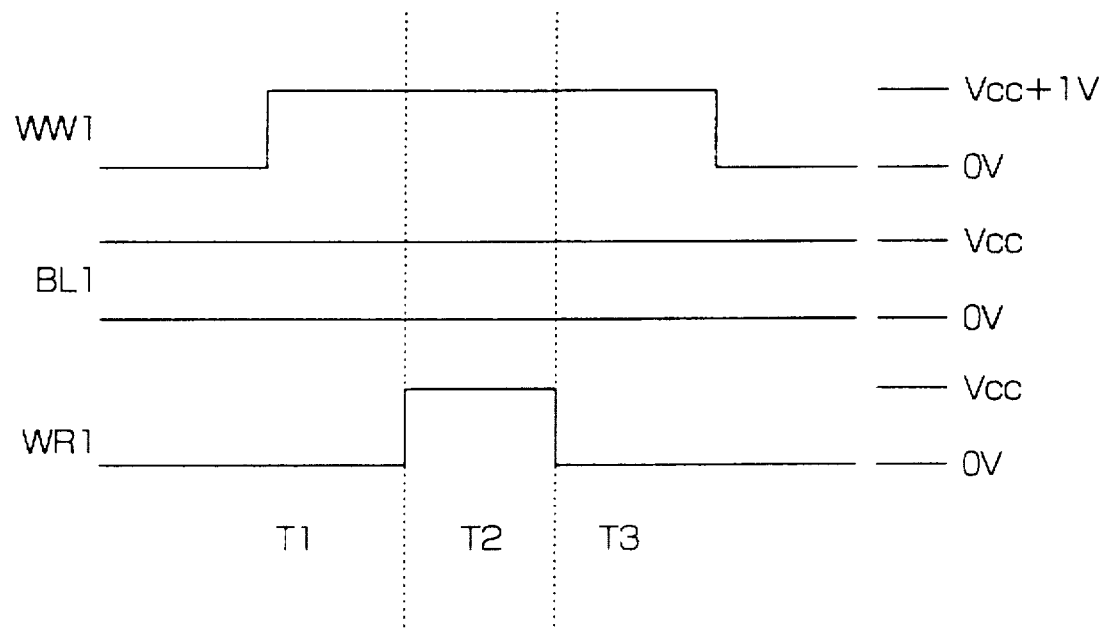
FIG. 12 is a timing chart showing the timing of erasing or writing of a memory cell CL11 shown in FIG. 8.

Next, an explanation will be made of the write and read operations of the memory cell array of FIG. 8 by referring to FIG. 12, FIG. 13, and FIG. 14. Note that, FIG. 12 is a potential timing chart of the interconnections in the case of writing data in the 1 bit memory cell CL11 designated by the word lines WW1 and WR1 and the bit line BL1 in FIG. 8.

First, an explanation will be made of the write operation.

As shown in the figures, the potential of the bit line BL1 is set to $V_{CC}$ or 0 V according to the binary data to be written. Also, at this time, the common source line SL is made open.

At a time domain T1, the set level of the word line WW1 connected to the gate electrode of the write transistor WT11 is switched from 0 V to [$V_{CC}$+1 V]. Here, the reason for applying a voltage higher than $V_{CC}$ by 1 V is that the threshold voltage Vth of the write transistor WT11 is less than 1 V, so it is necessary to prevent a so-called Vth drop due to the transistor.

Figure 13:
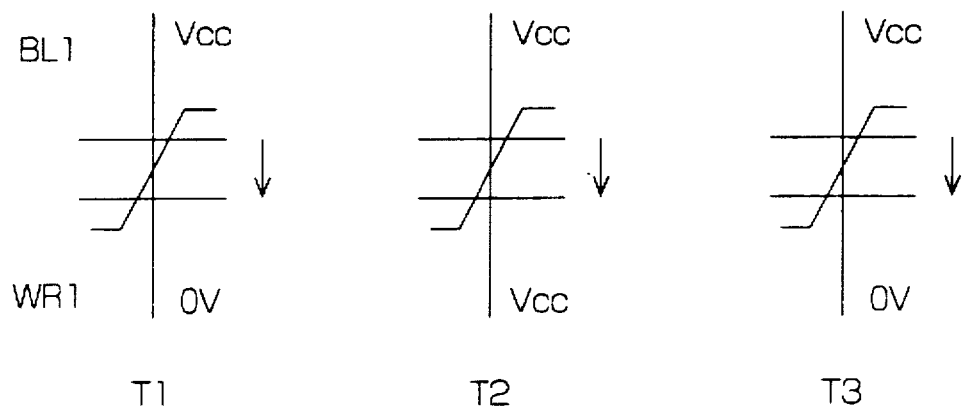
FIG. 13 is a view showing the polarization states at the timings shown in FIG. 12 in an operation for erasing the memory cell CL11 shown in FIG. 8.
Figure 14:
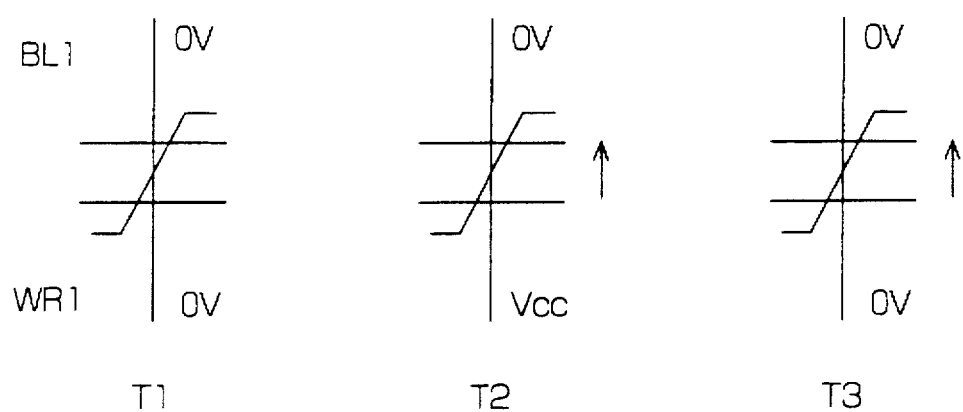
FIG. 14 is a view showing the polarization states at the timings shown in FIG. 12 in an operation for writing in the memory cell CL11 shown in FIG. 8.

Due to this, in the case where BL1=$V_{CC}$ (defined as the erase state), an electric field is applied to the ferroelectric capacitor FC11 and polarization is carried out in a direction indicated by an arrow in FIG. 13.

Subsequently, in a time domain T2, the potential of the word line WR1 connected to the ferroelectric capacitor FC11 is raised from 0 V to $V_{CC}$. By this, in the case where BL1=0 V (defined as the write state), an electric field is applied to the ferroelectric capacitor and an electric field is applied in a direction indicated by an arrow in FIG. 14.

Further, in a time domain T3, the write operation is terminated by switching the level of the word line WR1 from $V_{CC}$ to 0 V and then switching the word line WW1 from $V_{CC}$ to 0 V. Note that, here, it is also possible to first bring the level of the word line WW1 to 0 V and then bring the level of the word line WR1 to 0 V.

Note that, although not shown in the figures, where BL1=$V_{CC}$, after the end of the write operation, the potential $V_{CC}$ remaining in the electrode on the write transistor WT11 side of the ferroelectric capacitor FC11 drops to 0 V after a predetermined time due to the current leakage of the diffusion layer of the write transistor WT11.

The above explanation was made with reference to writing of a specific one bit, but in the present system, the bits connected to the same word line (WW1, WR1) are written all together.

Also, in said explanation, a pulse of $V_{CC}$ was applied to the word line WR1 after fixing the potential of the bit line, but also a method of fixing the word line WR1 to $V_{CC}$ or 0 V according to the binary data by the circuit system, and then applying the pulse of $V_{CC}$ to the bit line is possible.

Next, an explanation will be made of the read operation.

In this case too, in FIG. 8, a procedure where the memory cell CL11 of one bit designated by the word lines WW1 and WR1 is read will be explained.

First, the level of the word line WW1 is brought to 0 V, and the level of the bit line BL1 is brought to $V_{CC}$ or a positive fixed potential lower than this.

Next, the level of the word line WR1 is set to $V_{CC}$. By this, the gate electrode of the driver transistor DT11 connected to each bit line changes to different potentials according to the direction of polarization of the ferroelectric capacitor FC11. Here, the potential of the gate electrode is determined according to the capacitance ratio between the ferroelectric capacitor capacitance and the gate-substrate capacitance of the driver transistor, and the potential becomes lower in the write state than the erase state. Accordingly, at this time, the current driven by the driver transistor becomes larger in the erase state in comparison with the write state.

These different currents are detected by a not illustrated current sensing type sense amplifier connected to the bit line and then the read operation is terminated.

As explained above, according to the present embodiment, the memory cells CL11, CL12, CL21, and CL22, each corresponding to one bit, are constituted by three elements of the ferroelectric capacitors FC11, FC12, FC21, and FC22; the driver transistors DT11, DT12, DT21, and DT22 to whose gate electrodes one electrode of the ferroelectric capacitors FC11, FC12, FC21, and FC22 are connected and which control the current of the bit lines by the direction of the polarization of the ferroelectric; and write transistors WT11, WT12, WT21, and WT22 to whose source electrodes one electrode of the ferroelectric capacitors FC11, FC12, FC21, and FC22 are similarly connected and which perform the switching of conduction between the bit lines BL1 and BL2.

Since driver transistor and the ferroelectric capacitor are formed separate from each other and the write transistor and the driver transistor are formed clearly separate from each other, it is possible to realize a practical ferroelectric memory in which formation of the ferroelectric film 118 is easy and with which the degree of freedom of the capacitance ratio of the ferroelectric capacitor FC and the gate oxide film can be increased.

What is claimed is:

1. A ferroelectric memory comprising:

a memory transistor including a source electrode and a drain electrode separate from each other via a channel region at a surface of a semiconductor substrate, a first gate electrode serving as a floating gate electrode of said memory transistor and formed on said channel region via a gate insulator film, a ferroelectric film formed on said first gate electrode, and a second gate electrode serving as a control gate electrode of said memory transistor and formed on said ferroelectric film;

a write transistor operationally connecting a bit line and said first gate electrode of said memory transistor in accordance with a voltage applied to a third gate electrode serving as a gate electrode of said write transistor;

a plurality of memory cells, each said memory cell constituted by said memory transistor and said write transistor and arranged in a matrix;

a plurality of read word lines, each said read word line connected to said second gate electrodes of said memory transistor at row direction;

a plurality of write word lines, each said write word line connected to said third gate electrode of said write transistor at row direction; and a plurality of bit lines, each said bit line connected to said drain electrode of said memory transistor and said write transistor at column direction;

wherein a data storage is carried out in response to a direction of polarization of said ferroelectric film which corresponds to a magnitude and a sign of a voltage applied between said first gate electrode and second gate electrode of said memory transistor.

2. A ferroelectric memory as set forth in claim 1, wherein during a writing operation, said write transistor is enabled at an on state and writing data is determined by an applied voltage to said second gate electrode via corresponding bit line.

3. A ferroelectric memory as set forth in claim 2, wherein the data writing operation is carried out simultaneously against all memory cells in a single word line sector.

4. A ferroelectric memory as set forth in claim 1, wherein during a reading operation, said write transistor is enabled at an off state and reading data is determined by a magnitude of current flow between said drain electrode and said source electrode of said memory transistor via the corresponding bit line.

5. A ferroelectric memory as set forth in claim 4, wherein the data reading operation is carried out simultaneously against all memory cells in a single word line sector.

6. A ferroelectric memory as set forth in claim 1, wherein said write transistor is formed on said memory transistor in a vertical direction via an insulator film.

7. A ferroelectric memory as set forth in claim 6, wherein said write transistor is formed by a polycrystalline silicon thin film transistor.

8. A ferroelectric memory comprising:

a ferroelectric capacitor including a first electrode separated from a second electrode via a ferroelectric film;

a first transistor having a gate electrode connected to said first electrode of said ferroelectric capacitor and controlling the current of a bit line in accordance with the direction of polarization of said ferroelectric film;

a second transistor operationally connecting the bit line and said first electrode of said ferroelectric capacitor in accordance with a voltage applied to the gate electrode;

a plurality of memory cells, each said memory cell constituted by said ferroelectric capacitor and said first transistor and said second transistor and arranged in a matrix;

a plurality of read word lines, each said read word line connected to said second electrodes of said ferroelectric capacitor at row direction;

a plurality of write word lines, each said write word line connected to the gate electrodes of said second transistor at row direction; and a plurality of bit lines, each said bit line connected to a drain electrode of said first transistor and said second transistor at column direction;

wherein a data storage operation is carried out in response to a direction of polarization of said ferroelectric film which corresponds to a magnitude and a sign of a voltage applied between said first electrode and second electrode of said ferroelectric capacitor.

9. A ferroelectric memory as set forth in claim 1, wherein the data writing operation is carried out simultaneously against all memory cells in a single word line sector.

10. A ferroelectric memory as set forth in claim 5, wherein the data reading operation is carried out simultaneously against all memory cells in a single word line sector.

11. A ferroelectric memory as set forth in claim 7, wherein said gate electrode of said first transistor and said first electrode of said ferroelectric capacitor are connected by a third interconnection layer and said first transistor and said ferroelectric capacitor are formed separate from each other.

12. A ferroelectric memory as set forth in claim, 7 wherein at the time of write operation, said second transistor being enabled at an on state and the bit line is set to a predetermined potential in accordance with the write data, a pulse of a predetermined level is applied to the second electrode of said ferroelectric capacitor so as to polarize said ferroelectric capacitor in different directions according to the data.

13. A ferroelectric memory as set forth in claim, 7 wherein at the time of read operation, said second transistor being enabled at an off state and a predetermined potential being applied to the second electrode of said ferroelectric capacitor, the difference of a bit line current flowing via said first transistor is detected by the difference of the gate potential of said first transistor so as to read the direction of polarization of said ferroelectric capacitor corresponding to the data.

* * * * *